United States Patent
Reimer et al.

(10) Patent No.: US 8,580,133 B2
(45) Date of Patent: Nov. 12, 2013

(54) METHODS OF CONTROLLING THE ETCHING OF SILICON NITRIDE RELATIVE TO SILICON DIOXIDE

(75) Inventors: Berthold Reimer, Dresden (DE); Claudia Wolf, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 65 days.

(21) Appl. No.: 13/295,497

(22) Filed: Nov. 14, 2011

(65) Prior Publication Data

US 2013/0122716 A1    May 16, 2013

(51) Int. Cl.
*B44C 1/22* (2006.01)
*H01L 21/302* (2006.01)

(52) U.S. Cl.
USPC ............ 216/93; 216/83; 216/84; 216/95; 216/96; 438/745; 438/756; 438/757

(58) Field of Classification Search
USPC ............ 216/83, 84, 93, 95, 96; 438/745, 756, 438/757
See application file for complete search history.

(56) References Cited

U.S. PATENT DOCUMENTS

| | | | |
|---|---|---|---|
| 6,207,068 B1 * | 3/2001 | Glick et al. | 216/93 |
| 2001/0034130 A1 * | 10/2001 | Kusakabe et al. | 438/694 |
| 2004/0200806 A1 * | 10/2004 | Izuta et al. | 216/99 |
| 2008/0066864 A1 * | 3/2008 | Ballantine et al. | 156/345.18 |
| 2008/0087645 A1 * | 4/2008 | Izuta et al. | 216/93 |
| 2010/0124824 A1 * | 5/2010 | Eilmsteiner et al. | 438/757 |

* cited by examiner

*Primary Examiner* — Shamim Ahmed
(74) *Attorney, Agent, or Firm* — Williams, Morgan & Amerson, P.C.

(57) ABSTRACT

Disclosed herein are methods of controlling the etching of a layer of silicon nitride relative to a layer of silicon dioxide. In one illustrative example, the method includes providing an etch bath that is comprised of an existing etchant adapted to selectively etch silicon nitride relative to silicon dioxide, performing an etching process in the etch bath using the existing etchant to selectively remove a silicon nitride material positioned above a silicon dioxide material on a plurality of semiconducting substrates, determining an amount of the existing etchant to be removed based upon a per substrate silicon loading of the etch bath by virtue of etching the plurality of substrates in the etch bath and determining an amount of new etchant to be added to the etch bath based upon a per substrate silicon loading of the etch bath by virtue of etching the plurality of substrates in the etch bath.

18 Claims, 3 Drawing Sheets

METHODS OF CONTROLLING THE ETCHING OF SILICON NITRIDE RELATIVE TO SILICON DIOXIDE

BACKGROUND OF THE INVENTION

1. Field of the Invention

Generally, the present disclosure relates to the manufacturing of sophisticated semiconductor devices, and, more specifically, to various methods of controlling the etching of a layer of silicon nitride relative to a layer of silicon dioxide.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Etching processes, both wet and dry processes, are commonly employed to selectively etch one material relative to another material. Certain materials exhibit a relatively high etch selectivity relative to another material when both materials are exposed to the same etching process. For example, silicon nitride and silicon dioxide are two very common materials that may be selectively etched relative to one another using the appropriate etch chemistries, wherein the silicon nitride is removed and the silicon dioxide is only slightly etched. For example, silicon nitride may be selectively etched relative to silicon dioxide by performing a wet etching process using hot phosphoric acid as the etchant.

There are many applications where silicon nitride is etched relative to an underlying layer of silicon dioxide. In some of those applications, it is very important that the etching process consume all of the silicon nitride while not consuming too much or too little of the underlying layer of silicon dioxide. One situation where silicon nitride is etched relative to silicon dioxide is in the process used to form isolations structures for a semiconductor device. To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layers are patterned by performing an etching process through a patterned photoresist mask. Then, an etching process is performed to form trenches in the substrate for the STI structure using the patterned pad oxide layer and pad nitride layer as an etch mask. Thereafter, a deposition process is performed to overfill the trenches with an insulating material, such as silicon dioxide. A chemical mechanical polishing (CMP) process is then performed using the pad nitride layer as a polish-stop layer to remove the excess insulation material. Then, a subsequent deglazing (etching) process may be performed to insure that the insulating material is removed from the surface of the pad nitride layer. This deglaze process removes some of the STI structures. Thereafter, an etching process is performed to remove the pad nitride layer relative to the pad oxide layer. After the pad nitride layer is removed, the pad oxide layer may be used in subsequent processing operations, such as to act as a screen oxide during various ion implantation processes that are performed to form various doped regions in the semiconducting substrate. In many applications, it is very important that the thickness of the pad oxide layer be within a very tight thickness range.

The formation and removal of sidewall spacers is another situation where silicon nitride is commonly etched relative to an underlying layer of silicon dioxide. Typically, a relatively thin silicon dioxide liner layer is formed on the sidewalls of a gate electrode structure of a transistor and a silicon nitride sidewall spacer is formed on the silicon dioxide liner layer. In some process flows, it is desirable to remove the silicon nitride sidewall spacer while leaving the silicon dioxide liner layer in place. In such applications, it is very important to insure that all of the silicon nitride sidewall spacer is removed, while at the same time not excessively consuming the relatively thin silicon dioxide liner layer.

When silicon nitride is etched relative to silicon dioxide in a hot phosphoric acid bath, the amount of silicon dissolved in the bath increases due to the consumption of the silicon nitride material. This is generally referred to as "silicon loading" of the etching bath. If the silicon loading becomes too high, the etch rate of silicon dioxide greatly decreases and may even approach zero. In applications where a slight etching of an underlying layer of silicon dioxide is desired to insure complete removal of an overlying layer of silicon nitride, a relatively high silicon loading may effectively prevent or at least reduce the likelihood that the silicon nitride material is completely removed. High silicon loading of the etch bath can also lead to increased particle contamination of the processed wafers, which may adversely impact product yields.

Prior art techniques that have been employed in attempting to control the silicon loading of an etch bath when etching silicon nitride relative to silicon dioxide have been, at best, marginally successful and they have frequently not been applied in any uniform manner. One technique involves drawing off a certain amount of the existing etchant chemicals from the bath and adding a corresponding amount of "new" etchant chemicals after a set period of time has elapsed or after a set number of lots have been processed. For example, every three or so days, measurements will be taken of wafers processed in the etch bath to determine the etch rate of silicon dioxide in the bath. In some cases, using this technique, it has been determined that the etch rate of silicon dioxide may vary quite a bit, e.g., ±100%, between measurement periods. Once it is determined that the etch rate of silicon dioxide is too low, a predetermined amount of the existing etchant bath will be drained off and replaced with a corresponding amount of the "new" etchant chemicals—a "drain/replenish" operation will be performed. If it is determined that the etch rate of silicon dioxide is too high, the etch bath is seasoned with dummy silicon nitride wafers to increase the silicon loading and bring the etch rate back to a desired target level. This process is performed on an arbitrary schedule, e.g., every three days, independent of the number of wafers processed in the bath during that period. If the etch rate of the silicon dioxide layer was determined to be acceptable, the drain/replenish cycle was continued. If the etch rate of the silicon dioxide layer was determined to be unacceptable, the drain/replenish cycle was modified and additional testing on processed wafers was performed until such time as there was a relatively high degree of confidence that the etching process was producing acceptable results. This relatively crude form of process control resulted in an etching process that was less stable than would otherwise be desired and lead to defective devices and additional reworking of some defective substrates.

The present disclosure is directed to various methods of controlling the etching of silicon nitride relative to silicon dioxide that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of controlling the etching of a layer of silicon nitride relative to a layer of silicon dioxide. In one illustrative example, a method disclosed herein includes the steps of providing an etch bath that is comprised of an existing etchant that is adapted to selectively etch silicon nitride relative to silicon dioxide, performing an etching process in the etch bath on a plurality of semiconducting substrates using the existing etchant to selectively remove a silicon nitride material positioned above a silicon dioxide material on the substrates, determining an amount of the existing etchant to be removed from the etch bath based upon a per substrate silicon loading of the etch bath by virtue of etching the plurality of substrates etched in the etch bath and determining an amount of new etchant to be added to the etch bath based upon a per substrate silicon loading of the etch bath by virtue of etching the plurality of substrates etched in the etch bath.

In yet another example, a further illustrative method disclosed herein includes the steps of providing an etch bath that is comprised of an existing etchant that is adapted to selectively etch silicon nitride relative to silicon dioxide, performing an etching process in the etch bath on a plurality of semiconducting substrates using the existing etchant to selectively remove a silicon nitride material positioned above a silicon dioxide material on the substrates, determining an amount of the existing etchant to be removed from the etch bath based upon a total silicon loading of the etch bath by virtue of etching the plurality of substrates etched in the etch bath and determining an amount of new etchant to be added to the etch bath based upon the total silicon loading of the etch bath by virtue of etching the plurality of substrates etched in the etch bath.

BRIEF DESCRIPTION OF THE DRAWINGS

The disclosure may be understood by reference to the following description taken in conjunction with the accompanying drawings, in which like reference numerals identify like elements, and in which.

Figure 1A:
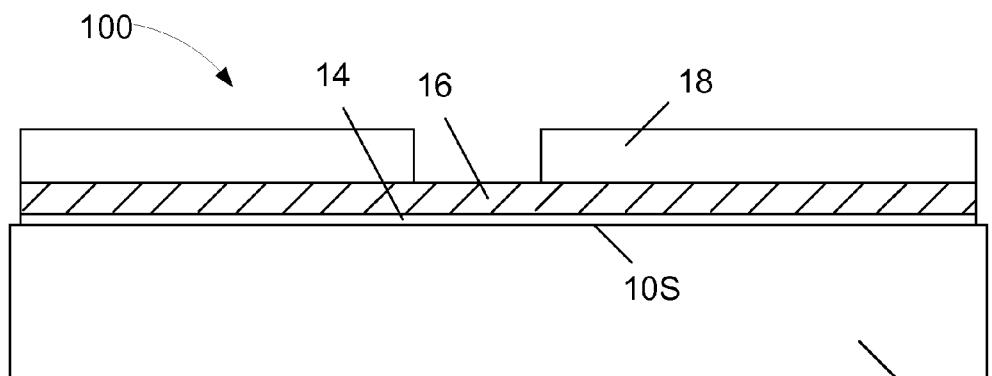
FIGS. 1A-1G depict various novel methods disclosed herein for forming isolation structures for semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of controlling the etching of silicon nitride relative to silicon dioxide. As will be readily apparent to those skilled in the art upon a complete reading of the present application, the present method is applicable to a variety of devices, including, but not limited to, ASICs, logic devices, memory devices, etc. With reference to the attached drawings, various illustrative embodiments of the methods disclosed herein will now be described in more detail.

The present invention will be disclosed in the context of the illustrative example where silicon nitride and silicon dioxide materials are employed in forming a shallow trench isolation structure. However, as will be recognized by those skilled in the art after a complete reading of the present application, the methods disclosed herein may be employed in any situation where silicon nitride is selectively etched relative to silicon dioxide.

FIG. 1A is a simplified view of an illustrative semiconductor device 100 at an early stage of manufacturing. The semiconductor device 100 is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In FIG. 1A, the device 100 is depicted at the point of fabrication where an illustrative pad oxide layer 14 and a pad nitride layer 16 have been formed above the substrate 10. Also depicted in FIG. 1A is a patterned mask layer 18, e.g., a patterned photoresist mask, that may be formed using traditional photolithography tools and techniques. In one illustrative example, the pad oxide layer 14 may have a thickness on the order of about 6-10 nm, and it may be formed by performing a thermal growth process. In one illustrative example, the pad nitride layer 16 may have a thickness on the order of about 80 nm, and it may be formed by performing a chemical vapor deposition (CVD) process.

Figure 1B:
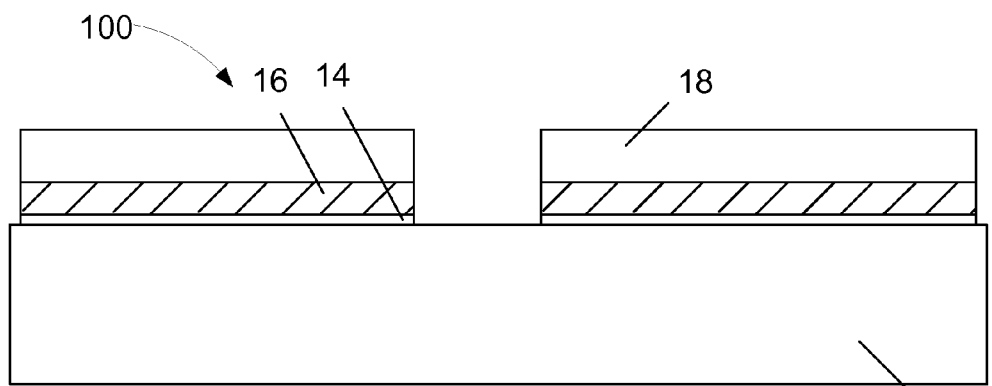
Figure 1C:
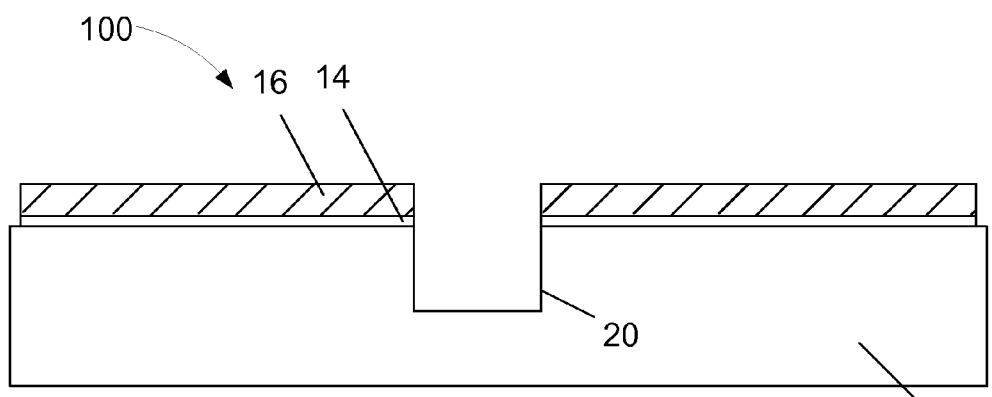

Thereafter, as shown in FIG. 1B, an etching process, such as a reactive ion etching process, is performed through the mask layer 18 to pattern the pad oxide layer 14 and the pad nitride layer 16. FIG. 1C depicts the device 100 after the masking layer 18 has been removed and the etching process has been performed to form a trench 20 in the substrate 10 using the combination of the patterned pad oxide layer 14 and pad nitride layer 16 as an etch mask. For ease of illustration, the trench 20 is depicted as having a generally rectangular cross-section. In real-world devices, the sidewalls of the trench 20 will likely be somewhat inwardly tapered. The dimensions of the trench 20 may vary depending on the particular application. In current day devices, the trench 20 may have a depth 20D of about 300-400 nm and a width of about 50-70 nm.

Figure 1D:
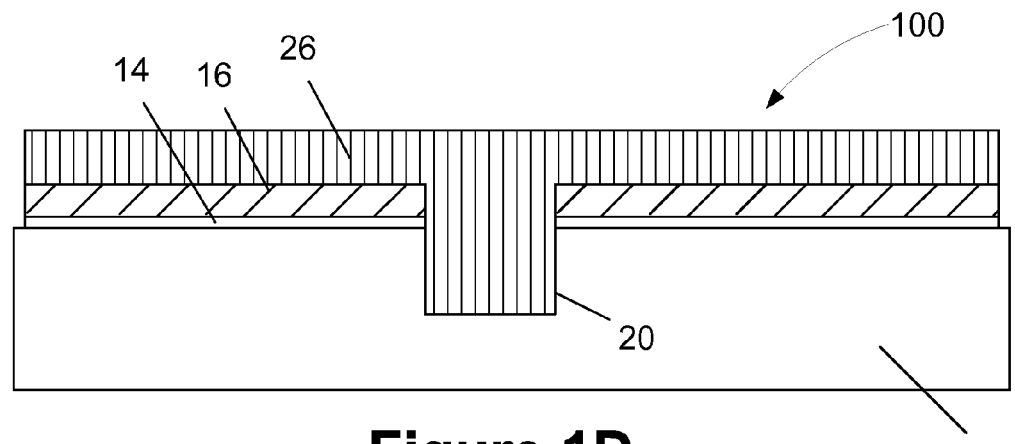

Next, as shown in FIG. 1D, a deposition process is performed to form a layer of insulating material 26 on the device 100 that over-fills the trench 20. The layer of insulating material 26 may be comprised of a variety of different materials, such as, for example, silicon dioxide, that may be made using a variety of different processes and chemistries, e.g., chemical vapor deposition (CVD), atomic layer deposition (ALD), etc., or plasma-enhanced versions of those processes. In one illustrative embodiment, the layer of insulating material 26 may be a silicon dioxide material made using a well-known HDP (High Density Plasma) process. Silicon dioxide material made using an HDP process will be referred to as an "HDP silicon dioxide."

Figure 1E:
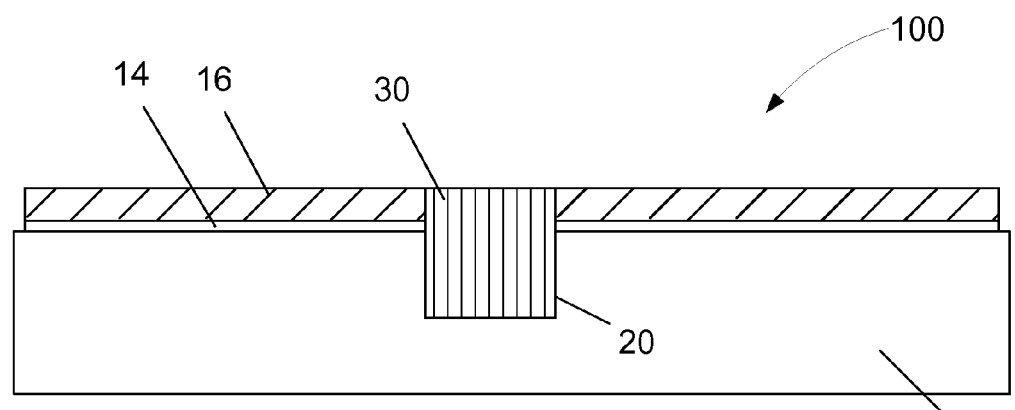

Next, as shown in FIG. 1E, a CMP process is then performed to remove the portions of the layer of insulating material 26 positioned above the surface of the pad nitride layer 16. This results in the formation of the trench isolation structure 30 in the trench 20. Thereafter, an etching or deglazing process is performed to insure that the surface of the pad nitride layer 16 is free of any remnants of the layer of insulating material 26. This deglaze process may reduce the thickness of the isolation structure 30 slightly, but such thickness reduction is not depicted in FIG. 1E.

Figure 1F:
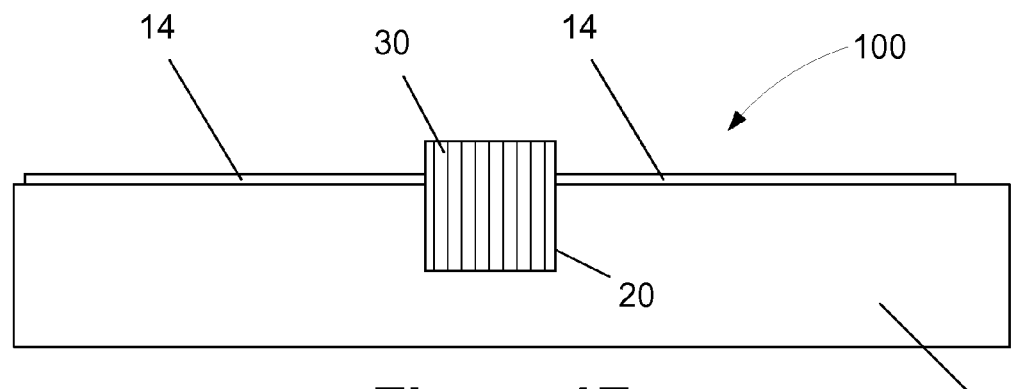

Then, as shown in FIG. 1F, a wet chemical etching process in performed to selectively remove the pad nitride layer 16 relative to the pad oxide layer 14. In one illustrative embodiment disclosed herein, the etching chemistry employed in this etching process may be a hot phosphoric acid (140-180° C.). The duration of the etching process depends upon a variety of factors, such as the thickness of the pad nitride layer 16 and the desired, if any, amount of etching of the underlying pad oxide layer 14.

According to one aspect of the present invention, in one illustrative embodiment, the amount of the chemical etchant that is drained from the etch bath and replenished is calculated based upon the number of wafers processed in the bath and/or the volume or amount of the dissolved silicon in the bath as a result of the silicon nitride material removed during the etching process. For example, knowing the diameter of a wafer, e.g., 8 or 12 inches, the volume of the illustrative silicon nitride layer 16 to be removed can be calculated, and the amount of silicon that will be dissolved in the chemical etchant bath can also be calculated on a volume per wafer basis. For example, for a wafer with an 80 nm thick layer of silicon nitride, the volume of dissolved silicon is around 11 $mm^3$ silicon nitride/wafer (80 nm×2 (front+back side)×3.14× $(0.15\ m)^2$. This number reflects the "silicon loading" of the chemical etchant on a per processed wafer basis. The volume of the dissolved silicon is also a function of the thickness of the layer of silicon nitride 16. For constant diameter wafers, the greater the thickness of the silicon nitride layer 16, the greater will be the silicon loading attributable to etching such a wafer.

In one illustrative embodiment disclosed herein, the amount of chemical etchant to be withdrawn and replenished is determined based upon the total volume of silicon dissolved by the wafers processed in the etch bath. This embodiment is very robust in that it is based on the silicon loading supplied by each wafer and can account for processing wafers having silicon nitride layers of different thicknesses and/or wafers having different diameters. As noted earlier, the amount of silicon added to the etch bath may be calculated ~11 $mm^3$ silicon/wafer in the above example. By empirical testing, acceptable levels of silicon dioxide etch rate may be established for given levels of total silicon loading added to the etch bath by processing a known number of wafers that contribute a total silicon loading to the etch bath (total silicon loading=number of wafers×silicon loading per wafer). With that information, acceptable levels of silicon loading before any of the etchant bath is subjected to the withdraw/replenish cycle may be determined or established. Once that threshold value of acceptable total silicon loading of the bath is met or exceeded, at the next available point in processing, the withdraw/replenish cycle may be performed with the amount of the etchant materials to be withdrawn and replaced based upon the total silicon loading of the etch bath; i.e., number of wafers processed multiplied by the silicon loading attributable to each processed wafer. In a very granular method, in the case where individual wafers are etched one at a time, the withdraw/replenish cycle could be performed after every wafer is processed. For example, in a 50 liter hot phosphoric acid bath, it has been determined that relatively stable etching rates for silicon dioxide may be maintained as long as the total silicon loading of the bath is within the acceptable range of about ±5 $mm^3$ of silicon nitride/liter. The etch rate of silicon dioxide will typically change with every processed lot, however, a range of ±5 $mm^3$ of silicon nitride/liter will typically provide a stable silicon dioxide etch rate. Once the silicon loading of the bath exceeds this allowable upper limit, as determined based upon the processing of a known number of wafers with a known silicon loading per wafer, the withdraw/replenish cycle may be commenced. To the extent the etch rate of silicon dioxide is determined to be too high, then dummy silicon nitride wafers may be processed through the bath until the silicon loading in the bath is within the acceptable range.

Figure 1G:
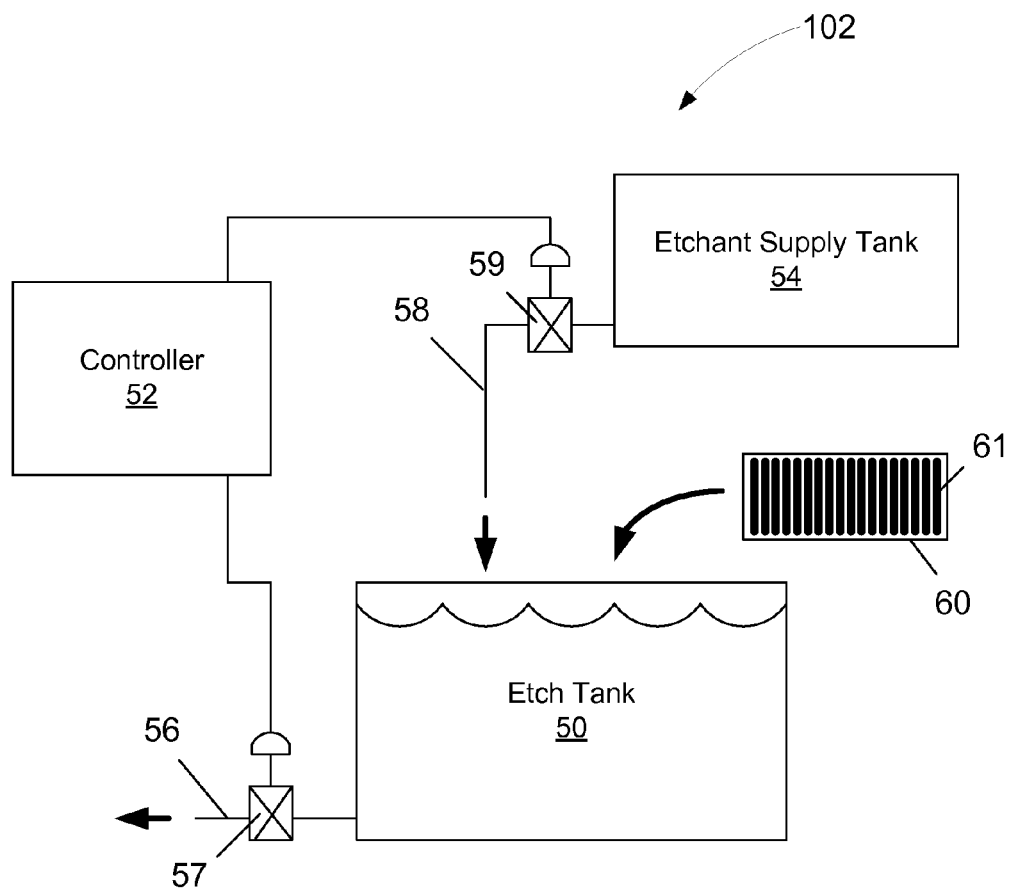

FIG. 1G schematically depicts one illustrative embodiment of a system 102 that may be employed to control the etching of silicon nitride relative to silicon dioxide as described herein. The system 102 generally comprises an etch tank 50, a controller 52, a new etchant supply tank 54, a drain line 56, with a metering valve 57 positioned therein, and a fill line 58, with a metering valve 59 positioned therein. Also schematically depicted in FIG. 1G is a schematically depicted lot 60 of wafers 61 that are to be etched in the etch tank 50. The number of wafers 61 in such a lot 60 may vary, but twenty-five wafers are typically present in each lot 60. In some cases, partial lots are processed in the system 102. Of course, depending upon the size of the etch tank 50, multiple lots 60 may be processed in a single batch. In one illustrative example, the etch tank 50 may have a capacity of about 50 liters.

In one example, the controller 52 tracks or receives input as to the number of wafers 61 processed in the etch tank 60 and, based upon the per wafer withdraw/replenish data for the type of wafers 61 being processed, calculates or looks-up the amount of the chemical bath to be withdrawn from the tank 50 via the drain line 56 and the amount of new etchant to be supplied to the etch tank 54 from the etchant supply tank 54. The controller 52 then sends the appropriate control signals to the illustrative valves 57, 59 to thereby cause the draining and filling activities to occur. Using the techniques disclosed herein, the composition of the etch bath remains more constant and more stable. In one particular embodiment, the methods disclosed herein act to maintain the composition of the chemical bath consistent with its properties when the entire bath was comprised of new chemical etchant before any layers of silicon nitride have been etched in the bath. Using the methods disclosed herein, the system may adjust the composition of the bath after every wafer is processed, after a set number of wafers have been processed, after a certain level of silicon loading has occurred in the etch bath and/or after a set number of wafer lots have been processed in the etch tank.

The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory or the like. The software program may be run on a variety of devices, e.g., a processor.

The commands from the controller 52 may be based upon calculations made in the controller or, based upon a database containing information correlating desired amounts of chemical etchant to be removed and added to the number of wafers processed, the silicon loading per wafer and/or the total silicon loading of the etch bath based on processing a number of wafers. The controller 52 may be any type of device that includes logic circuitry for executing instructions. Moreover, the controller 52 may be a stand-alone controller or it may be one or more related processing tools.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the pad oxide sought herein is as set forth in the claims below.

What is claimed:

1. A method, comprising:
providing an etch bath that is comprised of an existing etchant that is adapted to selectively etch silicon nitride relative to silicon dioxide;
performing an etching process in said etch bath on a plurality of semiconducting substrates using said existing etchant, each of said substrates having a silicon nitride material positioned above a silicon dioxide material, to remove said silicon nitride material selectively relative to said silicon dioxide material, wherein each of said plurality of semiconducting substrates, when etched, individually adds a per substrate silicon loading to said etch bath; and
determining an amount of said existing etchant to be removed from said etch bath based upon a total silicon loading of said etch bath which is determined by multiplying the number of said plurality of substrates etched in said etch bath and said per substrate silicon loading.

2. The method of claim 1, further comprising determining an amount of new etchant to be added to said etch bath based upon said total silicon loading of said etch bath.

3. The method of claim 1, wherein said silicon dioxide material is a pad oxide layer formed on a surface of said substrate, and wherein said silicon nitride material is a pad nitride layer formed on said pad oxide layer.

4. The method of claim 1, further comprising removing said amount of said existing etchant from said etch bath.

5. The method of claim 2, further comprising adding said amount of said new etchant to said etch bath.

6. The method of claim 5, further comprising processing at least one additional substrate in said etch bath after adding said new etchant to said etch bath.

7. A method, comprising:
providing an etch bath that is comprised of an existing etchant that is adapted to selectively etch silicon nitride relative to silicon dioxide;
performing an etching process in said etch bath on a plurality of semiconducting substrates using said existing etchant, each of said substrates having a silicon nitride material positioned above a silicon dioxide material, to remove said silicon nitride material selectively relative to said silicon dioxide material, wherein each of said plurality of semiconducting substrates, when etched, individually adds a per substrate silicon loading to said etch bath; and
determining an amount of new etchant to be added to said etch bath based upon a total silicon loading of said etch bath which is determined by multiplying the number of said plurality of substrates etched in said etch bath and said per substrate silicon loading.

8. The method of claim 7, further comprising determining an amount of said existing etchant to be removed from said etch bath based upon said total silicon loading of said etch bath.

9. A method, comprising:
providing an etch bath that is comprised of an existing etchant that is adapted to selectively etch silicon nitride relative to silicon dioxide;
performing an etching process in said etch bath on a plurality of semiconducting substrates using said existing etchant, each of said substrates having a silicon nitride material positioned above a silicon dioxide material, to remove said silicon nitride material selectively relative to said silicon dioxide material; and
determining an amount of said existing etchant to be removed from said etch bath based upon a per substrate silicon loading of said etch bath by virtue of etching said plurality of substrates etched in said etch bath.

10. The method of claim 9, further comprising determining an amount of new etchant to be added to said etch bath based upon said per substrate silicon loading of said etch bath by virtue of etching said plurality of substrates etched in said etch bath.

11. The method of claim 9, wherein said silicon dioxide material is a pad oxide layer formed on a surface of said substrate, and wherein said silicon nitride material is a pad nitride layer formed on said pad oxide layer.

12. The method of claim 9, further comprising removing said amount of said existing etchant from said etch bath.

13. The method of claim 10 further comprising adding said amount of said new etchant to said etch bath.

14. A method, comprising:
providing an etch bath that is comprised of an existing etchant that is adapted to selectively etch silicon nitride relative to silicon dioxide;
performing an etching process in said etch bath on a plurality of semiconducting substrates using said existing etchant, each of said substrates having a silicon nitride material positioned above a silicon dioxide material, to remove said silicon nitride material selectively relative to said silicon dioxide material; and
determining an amount of new etchant to be added to said etch bath based upon a per substrate silicon loading of said etch bath by virtue of etching said plurality of substrates etched in said etch bath.

15. The method of claim 14, further comprising determining an amount of said existing etchant to be removed from said etch bath based upon said per substrate silicon loading.

16. A method, comprising:
providing an etch bath that is comprised of an existing etchant that is adapted to selectively etch silicon nitride relative to silicon dioxide;
performing an etching process in said etch bath on a plurality of semiconducting substrates using said existing etchant, each of said substrates having a silicon nitride material positioned above a silicon dioxide material, to remove said silicon nitride material selectively relative to said silicon dioxide material;
determining an amount of said existing etchant to be removed from said etch bath based upon a total silicon loading of said etch bath by virtue of etching said plurality of substrates etched in said etch bath; and
determining an amount of new etchant to be added to said etch bath based upon said total silicon loading of said etch bath by virtue of etching said plurality of substrates etched in said etch bath.

17. The method of claim 16, wherein said silicon dioxide material is a pad oxide layer formed on a surface of said substrate, and wherein said silicon nitride material is a pad nitride layer formed on said pad oxide layer.

18. The method of claim 16, further comprising:
removing said amount of said existing etchant from said etch bath; and
adding said amount of said new etchant to said etch bath.

* * * * *